United States Patent [19]

Ishigure et al.

[11] Patent Number: 4,559,530

[45] Date of Patent: Dec. 17, 1985

[54] OVERCURRENT CONDITION DISPLAY

[75] Inventors: Masao Ishigure, Gifu; Mitsuo Ota, Nagoya; Naotoshi Takaoka, Inuyama; Mitsuharu Kudomi, Konan, all of Japan

[73] Assignee: Takamatsu Electric Works, Ltd., Inuyama, Japan

[21] Appl. No.: 433,173

[22] Filed: Oct. 5, 1982

[30] Foreign Application Priority Data

Dec. 29, 1981 [JP] Japan ............................... 56-215882
Dec. 29, 1981 [JP] Japan ............................... 56-215883

[51] Int. Cl.4 ............................................. G08B 21/00

[52] U.S. Cl. .................................... 340/664; 324/133; 340/815.24

[58] Field of Search ........... 340/664, 788, 783, 815.23, 340/815.24, 815.25, 815.26, 815.29, 815.1; 324/133; 116/227, 212, 281

[56] References Cited

U.S. PATENT DOCUMENTS

| | | | |
|---|---|---|---|
| 699,140 | 5/1902 | Blake | 340/815.24 |
| 2,432,875 | 12/1947 | Flint | 116/227 X |
| 3,253,215 | 5/1966 | Moakler et al. | 340/664 X |
| 3,419,791 | 12/1968 | Mishkovsky | 340/664 X |
| 4,079,368 | 3/1978 | DiStefano | 340/783 X |

*Primary Examiner*—James L. Rowland
*Assistant Examiner*—Daniel Myer
*Attorney, Agent, or Firm*—Jordan and Hamburg

[57] ABSTRACT

An overcurrent condition display suspended directly from a distribution cable for displaying overcurrent conditions in the cable and for promptly locating spots of accidents due to overcurrent conditions comprises a current sensor section having a current transformer, a drive section provided with a drive element adapted to be driven by the sensed overcurrent and with a force storage member adapted to be actuated by the drive element and to act as a restoring member as well for the drive element, a drive-transmission section actuated by the force storage member and a display section having a display tube with a transparent bottom, a viscous fluid stored in the tube and a display element connected to the drive-transmission section for vertical motion through the fluid. The overcurrent condition is displayed when the display element is hoisted by the drive-transmission section. The display of the normal condition is established when the display element has descended slowly under the influence of its own gravity and the viscosity resistance of the fluid in a prolonged time interval.

33 Claims, 30 Drawing Figures

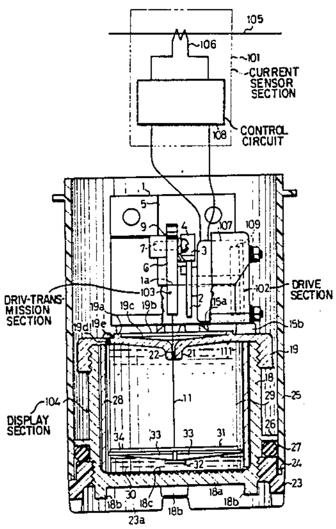

105
106
101
CURRENT SENSOR SECTION
108
CONTROL CIRCUIT
1
5
9
4
107
109
7
3
6
1a
103
2
102
DRIVE SECTION
DRIV-TRANS-MISSION SECTION
19a
19c
19b
15a
15b
19d
19e
22
21
111
19
18
104
DISPLAY SECTION
28
11
29
25
26
34
33
33
31
27
32
24
30
18a
23
18b
18c
18b
18b
23a 4
13
3
14
13a
16
12
6

13
14
13a
4
3
16
12
6

13
14
13a
4
12
16
6
3

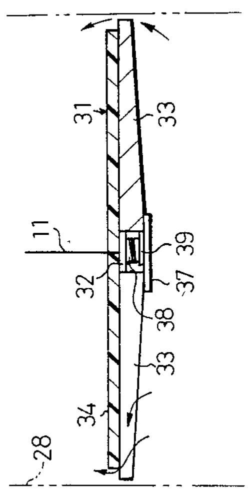
FIG. 10
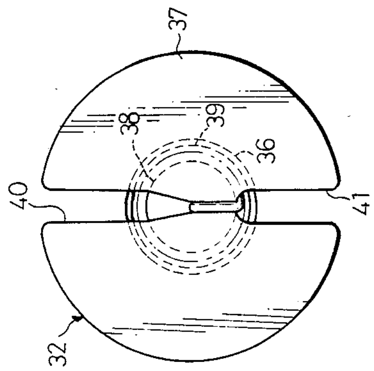
FIG. 11b
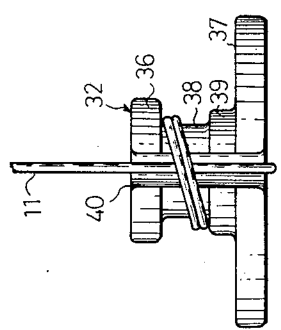
FIG. 11a
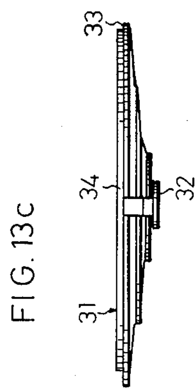
FIG. 13c
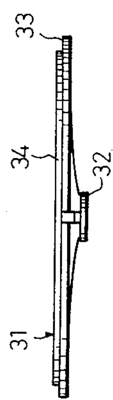
FIG. 13b
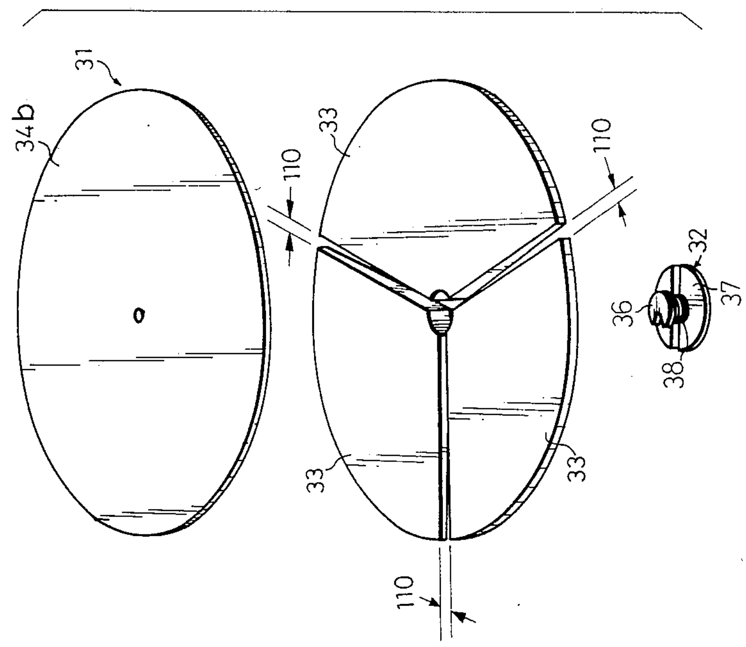
FIG. 8
FIG. 13a

OVERCURRENT CONDITION DISPLAY

FIELD OF THE INVENTION

This invention relates to an overcurrent condition display suspended directly from a distribution cable for displaying overcurrent conditions brought about by accidents in the cable, such as grounding or shortcircuiting and for promptly locating spots of accidents.

BACKGROUND OF THE INVENTION

An overcurrent condition display is used mainly as a means for locating promptly those spots on a distribution cable where overcurrent conditions have occurred. The display is required usually to remain in a display state for 3 to 7 hours necessary for inspections and to be restored to a normal state after the lapse of a predetermined time.

One known device of this kind is suspended directly from a distribution cable and set in operation by an overcurrent sensed by a current transformer. However, the device of this kind is actuated mechanically by the direct electromagnetic force of the sensed overcurrent and hence, for practical purposes, the mechanical operation of the display must be more speedy than that of overcurrent relays at a substation. In effect, a fault current is usually of the order of magnitude of 600 to 1000 amperes and lasts only almost in an instant. With the electric power of such character, it is extremely difficult to actuate a display instantly, to maintain the display state for a prescribed time and yet to restore the display automatically to the original normal state. In particular, it is really difficult to establish a prolonged time limit of the order of several hours with a simple and maintainance-free mechanism.

OBJECTS OF THE INVENTION

It is an object of the present invention to provide an overcurrent condition display adapted for sensing instantly the passage of an overcurrent for a reliable accident display and adapted for being restored automatically to the normal state, after the lapse of a predetermined time.

It is another object of the present invention to provide an overcurrent condition display which is reduced in its whole size by using a smaller number of component parts, may be assembled more reliably and simply and thereby gives a more reliable display of the overcurrent conditions.

It is still another object of the present invention to provide an overcurrent condition display wherein the time limit of several hours required for the restoration of a display element is obtained by lowering the display element very slowly in a viscous fluid under the influence of the own gravity of the element and the viscosity resistance of the fluid.

Still another object of the present invention is to provide an overcurrent condition display wherein the display element is hoisted quickly in the fluid by the action of a spring biased by the electromagnetic force of the overcurrent and the hoisted state of the display element displays the overcurrent condition.

It is still another object of the present invention to provide an overcurrent condition display wherein a display valve as the display element may be recurved downwards only within a preset limit when the display valve is pulled up.

It is still another object of the present invention to provide an overcurrent condition display wherein the display valve is positioned slightly above the transparent bottom surface or the display window of a display tube storing the fluid for displaying the normal state and may be raised quickly without meeting with any substantial resistance upon start of the display operation.

It is still another object of the present invention to provide an overcurrent condition display wherein the fluid under the display valve can be displaced towards the side surface of the display tube simultaneously with the descent of the display valve and thus the display valve may be descend smoothly on account of its own gravity.

It is still another object of the present invention to provide an overcurrent condition display wherein the display valve is more weighted at the lower portion of it than at the upper portion so that the valve may descend stably and without tilting under the influence of its own gravity.

It is still another object of the present invention to provide an overcurrent condition display wherein the effective specific gravity of the display valve as the whole can be changed easily for adjusting finely the prolonged descent time of the display valve.

Still another object of the present invention is to provide an overcurrent condition display wherein the display tube contains a lower layer of a transparent fluid and an upper layer of a colored viscous fluid and the color of the viscous fluid can be viewed as the indication of the overcurrent conditions through the bottom of the display tube.

Still another object of the present invention is to provide an overcurrent condition display wherein the fluid stored in the display tube can be prevented from leaking to the outside of the tube to exert a harmful influence upon the operation of adjacent components even when the tube is topsy-turvied or subjected to rolling.

It is still another object of the present invention to provide an overcurrent condition display wherein the fluid may be stored on the upper surface of the display tube and therby prevented from overflowing to the outer periphery of the display tube upon the thermal expansion of the fluids.

It is still another object of the present invention to provide an overcurrent condition display wherein the overcurrent condition display status can be observed easily from off the lower lateral side of the display tube as well as directly below it for the purpose of broadening the field of view of the display state.

It is still another object of the present invention to provide an overcurrent condition display wherein the display tube can be erected upright on a base member at the time of assembling and yet such lower surface of the tube as used simultaneously as a display window is not damaged then.

It is yet another object of the present invention to provide an overcurrent condition display which may be free from any such erroneous observation of the display state as brought about by the contamination of the display window with the colored fluid.

These and other objects of the present invention will be more apparent from the following detailed description of preferred embodiments and appended claims. Many advantages in practicing the invention, though not specified in the present specification, will readily occur to those who are skilled in the art.

BRIEF DESCRIPTION OF THE DRAWINGS

FIG. 8 is an enlarged exploded perspective view of the display valve, FIG. 10 is a sectional view of the display valve showing simultaneously the state of transfer of the colored fluid while the display valve is descending, FIGS. 11*a* and 11*b* are front and bottom views of the stop member, respectively, FIGS. 13*a* to 13*c* are front elevational views showing modifications of the display valve.

DETAILED DESCRIPTION OF THE PREFERRED EMBODIMENTS

Figures 12, 14, 15, 16A, 16B, 17A, 17B, 18, 19:
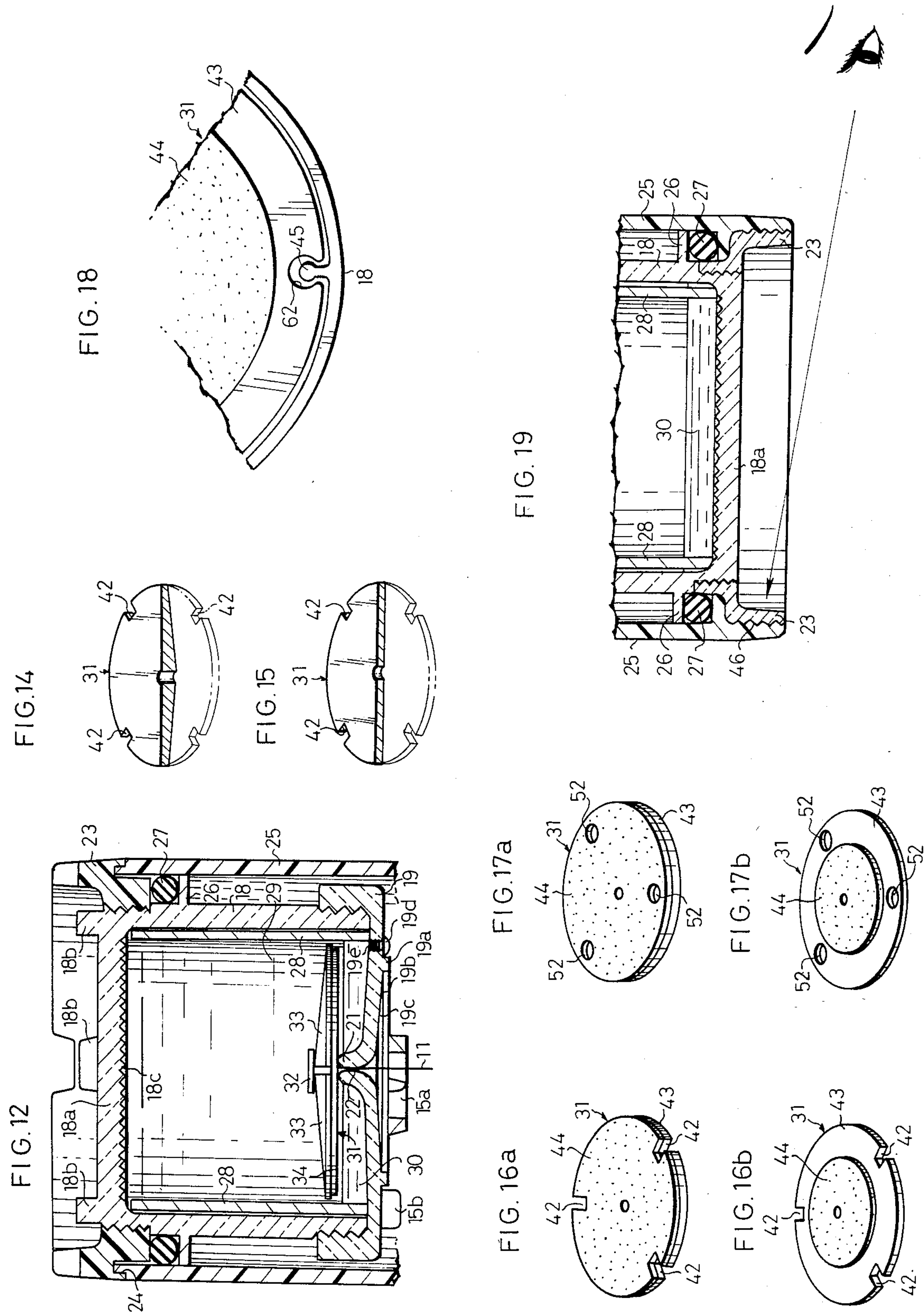
FIG. 12 is a partially sectional view of the display in the topsy-turvied state.
FIGS. 14 and 15 are perspective views in partial section showing two modifications of a display valve formed integrally.
FIGS. 16*a* and 16*b* are perspective views showing two modifications of a display valve, each modification being made up of a display plate and a float member and having peripheral cuts.
FIGS. 17*a* and 17*b* are perspective views showing two modifications of a display valve, each modification being made up of a display plate and a float member and having peripheral through holes for fluid flow.
FIG. 18 is an enlarged partial plan view of a display valve adapted to be guided by a rib forward on the display valve.
FIG. 19 is a partial sectional view of a display wherein a casing member is extended to cover a skirt portion.

In what follows, an embodiment of the present invention is elucidated in reference to FIGS. 1 to 11.

The overcurrent display according to the present invention is composed generally of a current sensor section 101 for sensing an overcurrent, a drive section 102 actuated by said sensor section to effectuate a further driving operation, a drive-transmission section 103 actuated by said drive section 102 to effectuate a hoisting operation and a display section 104 actuated by said drive-transmission section 103 to effectuate a display operation.

First the sensor section 101 is described. This sensor section 101 is composed of a sensing current transformer 106 mounted on a distribution cable 105, and of a control circuit 108 adapted to control a current generated in the current transformer 106 for driving a rotary solenoid 107 when an overcurrent flows through the cable 105.

The drive section 102 is now described. When the rotary solenoid 107 as a drive element is energized, the output shaft of it is driven in rotation. When the solenoid becomes deenergized, the output shaft is restored to the original position by the operation of an enclosed restoring spring 109 acting as a force storage element as well.

Figure 1:
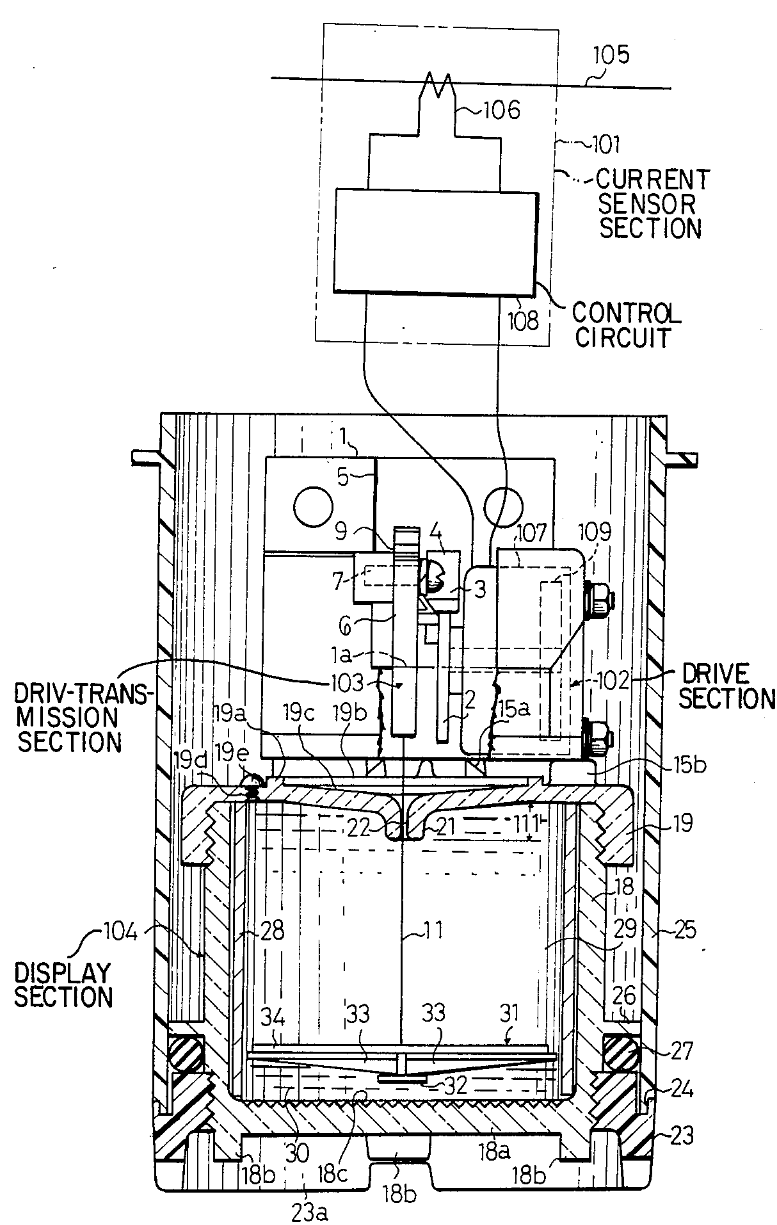
FIG. 1 is a sectional view of an overcurrent condition display embodying the present invention with a portion of the display being shown only diagrammatically.
Figure 2:
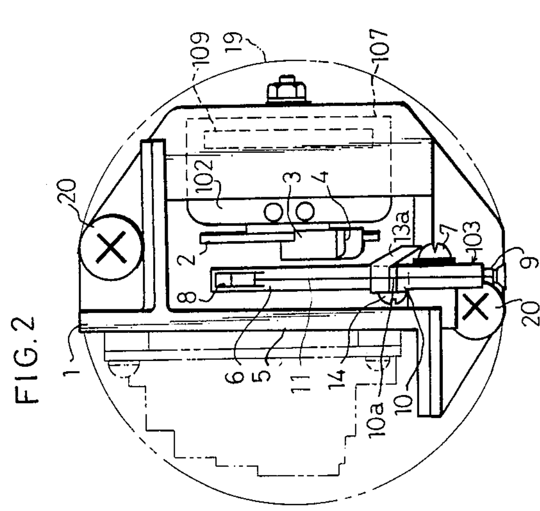
FIG. 2 is a plan view of a drive means and a drive-transmission means of the display.

In FIGS. 1 and 2, the numeral 1 denotes a frame suspended from the lower portion of a cable clamp, not shown, and the rotary solenoid 107 is secured to the frame 1. The numeral 2 denotes a discoid drive plate secured to the output shaft of the rotary solenoid 107. The numeral 3 denotes an operating member secured to the peripheral portion of the drive plate 2 and having a radially outwardly projecting pawl 4.

The drive section 102 is made up of the rotary solenoid 107, the drive plate 2 and the operating member 3.

Figure 4A:
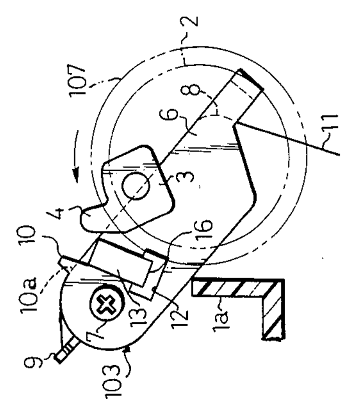
FIGS. 4*a* to 4*e* are side elevational views illustrating the operating member of the drive-transmission means engaging with and elevating the hoist member.

The drive-transmission section 103 is now explained. The numeral 5 denotes a support plate mounted on the frame 1 upright in opposition to said rotary solenoid 107. The numeral 6 denotes a hoist member whose base end is connected pivotally to the support plate for vertical pivotal motion at a shaft 7, said base end being located in the upper front portion of the rotary solenoid 107 (to the upper left-hand side in FIG. 4). In the normal state, the hoist member 6 is held by a stopper **1*a* mounted in turn on the lower part of the frame 1 as shown in FIG. 4*a*. The foremost part of the hoist member 6 has a through guide hole 8 extending vertically, while the base end of the hoist member has a mounting projection 9 and a guide projection 10 which is located above the pivot shaft 7 and has a central slit 10*a***.

The numeral 11 denotes a string member connected at its one end to said projection 9, then passed through the slit **10*a* of the guide projection 10 and extended downwards through the guide hole 8. The string member 11 is secured with an adhesive at the projection 9 and at the slit 10*a* in the guide projection 10. The numeral 12 denotes a through hole bored in the base end of the hoist member 6**.

Figure 3A:
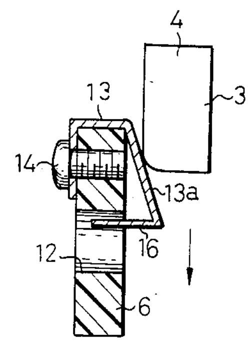
FIGS. 3*a* to 3*c* are views in partial section for illustrating various states where a stop member mounted on a hoist member engages with an operating member.
Figure 3B:
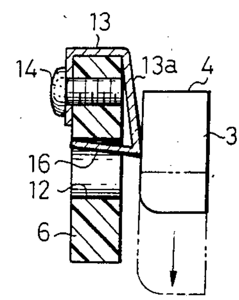

As is shown in FIGS. 3 and 4, the numeral 13 denotes a resilient stop member secured by a screw at the base end thereof to a side of the hoist member 6 opposite to the rotary solenoid 107, and acting as a cam member. The stop member 13 is bent so that it is wound around the upper portion of the hoist member 6 and extended down obliquely towards the rotary solenoid 107. The foremost end of the stop member is then bent acutely towards the hoist member 6 and loosely inserted into a through hole 12. The obliquely extending portion **13*a* of the stop member 13 is adapted to be pressed by the pawl 4 of the operating member 3 against its resilient force and to be retreated towards the hoist member 6 (to the left in FIG. 3) upon the rotational movement of the member 3 from above towards below as shown in FIG. 3*b*. The lower forward surface 16 of the stop member 13 is in position to engage with or disengage from the pawl 4**.

The hoist section or the drive-transmission section 103 is made up of the hoist member 6, the string member 11 and the stop member 13.

The display section 104 is now described. The numeral 18 in FIG. 1 denotes a display tube made of colorless transparent synthetic resin or glass in the form of a bottomed cylinder. The display tube 18 is provided with a transparent cap 19 of synthetic resins attached threadedly and fluidtight to the open upper end of the display tube 18 and the cap 19 is in turn secured to the frame 1 by bolts 20 (FIG. 2).

The upper central surface of the cap 19 is formed with a funnel-shaped recessed guide surface 19*c*, while the central portion of the lower surface thereof is extended to form a projection 21 of a height 111, and a thin through insertion opening 22 is bored through said projection for extending vertically. The upper and lower ends of the insertion opening 22 are beveled as shown. The length of the opening 22 is set to a value such that an overflow volume due to the thermal expansion of the below mentioned fluids 29 and 30 stored in the display tube 18 may be absorbed within said opening 22 up to a predetermined limit of temperature rise. On the other hand, the thickness of the insertion opening 22 is adjusted so that the below mentioned colored fluid 29 may be prevented by the viscosity thereof from leaking out even if the fluid with its top surface found in the opening 22 is subjected to topsy-turviness or rolling.

The numeral 19*a* denotes an annular rib on the upper surface of the cap 19 encircling said guide surface 19*c* and defining an overflow liquid storage section 19*b* together with said surface 19*c*. The storage section 19*b* is designed for storing a certain volume of the fluids 29 and 30 overflowing from the insertion opening 22 when the temperature of the external environment has been raised above a predetermined value.

The numeral 19*d* denotes a female threaded air vent through hole bored through the cap 19 at a position radially outwardly from the rib 19*a*. A screw 19*e* is driven fluidtight in the air vent hole 19*d* while the display is in use.

The numeral 15*a* denotes a female threaded projection for attaching the frame 1 to the cap 19, and the numeral 15*b* a support projection abutting on the lower surface of the frame 1.

The numeral 18*c* denotes a deposit preventing portion provided substantially on the whole inner surface of the bottom of the display tube 18 and is indented with a multiplicity of concentric grooves of a V-shaped cross-section. The deposit preventing portion 18*c* may be formed of numerous recesses of a moderate depth studded substantially on the whole inner surface of the bottom of the display tube 18 for the purpose of preventing the colored fluid 29 in the display tube 18 from being deposited on said inner surface of the bottom due to the viscosity and surface tension of the fluids when the display is subjected to a rolling caused by wind pressure and so on. Alternately, the deposit preventing portion may be composed of such recesses as arranged in lattices or rows. In the present embodiment, the groove of the deposit preventing portion 18*a* is approximately 1.3 mm in depth. The numeral 18*b* denotes plural, herein four, legs extending downwards from the lower side surface of the display tube 18.

The numeral 23 denotes a black skirt member fitted threadedly to the lower side surface of the display tube 18 and has a peripheral fitting groove 24. The groove 24 is engaged by the lower end of a cylindrical casing member 25 connected, in turn, at the upper end surface thereof to the lower surface of the cable clamp not shown.

The numeral 26 denotes a stop rib formed on the outer periphery of the tube 18 so as to lie over the skirt member 23, and between said rib and the upper surface of the skirt member, a fluid-tight O-ring 27 is fitted abuttingly on the inner surface of the member 25 and on the outer surface of the display tube 18.

The numeral 28 denotes a silver-colored cylindrical reflector made of aluminum or the like, said reflector being fitted inside the display tube 18. The numerals 29 and 30 denote fluids stored in required amounts to form an upper layer and a lower layer within the display tube 18, one of said fluids being colored, herein red, more viscous and of lower specific density and the other being transparent (or at least translucent), herein colorless less viscous and of higher specific density. Preferably, the ratio of the specific density of the two fluids may be set to a value higher than 2.0 for more stable separation of the two fluid layers. However, a ratio not less than 1.5 is as well acceptable for the separation provided that the fluids are allowed to stand over a sufficiently long time.

The fluids 29 and 30 are charged in the tube 18 in such manner that the transparent fluid 30 is filled to a depth less than the height 111 of the projection 21 and the colored fluid 29 is filled so as to occupy the remaining volume of the display tube 18.

Preferably, the fluids 29 and 30 may have characteristics which will be changed in viscosity only in a least degree under changes in the conditions of outside environments. For instance, silicone oil may be used as the colored fluid 29 and fluorinic inactivated liquids such as Fluorinate (registered trademark owned by Minnesota Mining & MFG Company) or fluorocarbon may be used as the transparent fluid 30.

The numeral 31 denotes a display valve immersed at all times within the fluid 29 or 30. The lower end of the string member 11, passed through the insertion opening 22 of the cap 19, has its lower end held by a stopper member 32 abutting in turn on the lower surface of the display valve 31.

This display valve as a display element as shown in FIG. 8 is made up of fan-shaped valve segments 33 and a thin circular connecting member 34 adhered to the upper surfaces of the valve segments 33 and made of a resilient material of the closed cell type, such as of polyethylene. The valve segments 33 may be obtained by dividing a silver-colored to white-colored disk of aluminum or the like light metal into an odd number, herein three, of equal segments and the segments are aligned with a predetermined gap 110 between any two of adjacent segments as shown in FIG. 8.

The fan-shaped valve segments 33 are protruded at the outer peripheral edges thereof beyond the peripheral edge of the connecting member 34 for defining cuts 42 between any two adjacent protruded edges. The underside of each fan-shaped valve segment 33 is inclined so that the segment may be thickened from the outer periphery towards the center, and thus the underside of the display valve 31 may assume a gentle conical surface as a whole. Hence, as it comes toward the central portion of the valve 31 weight of the valve increases. However, any of such underside contours of the display valve 31 as descending towards the center as shown in FIGS. 13*a* to 13*c* may be used within the scope of the present invention.

Referring to FIG. 11, the stopper member 32 has an abutting flange 36 at the upper end for abutting centrally on the underside of the connecting member 34, and a stop flange 37 at the lower end for centrally engaging the underside of each valve segment 33, said flange 37 being of a diameter larger than that of the abutting flange 36. Beneath the abutting flange 36 are formed an engaging barrel 38 for guiding said string member 11 and an engaging step 39 of a diameter less than that of the abutting flange 36 but larger than that of the barrel 38.

The stopper member 32 is formed with a first cut 40 extending from the outer edges to the centers of the abutting flange 36, the stop flange 37, the barrel and the step 39 and with a second cut 41 diametrically opposite to said first cut 40 and extending through the stop flange 37 and the step 39 to the surface of the engaging barrel 38. The string member 11 is inserted at the lower end thereof into a central aperture 34*b* of the connecting member 34 from above and then passed in the cut 40 from above, turned on the underside of the stop flange 37, introduced into the cut 41 from below and wound about the barrel 38 for undetachably holding the string member 11 within the cut 40. The foremost part of the string member 11 is then secured in position by being inserted between the turns of the string member 11 on the barrel 38 or by being affixed to the barrel 38 with a suitable adhesive.

The display valve 31 is mounted for vertical motion with a small gap between itself and the inner surface of the reflector 28. The connecting member 34 may be flexed down or recurved at three bendable or flexible portions 34*a* (see FIG. 9) formed along the gaps 110 so that the valve segments 33 may be tilted down slightly about the center of the valve 31.

When the peripheral portion of each valve segment 33 is tilted down, the central underside of each valve segment 33 abuts on the upper surface of the stop flange 37 of the stopper member 32. In this manner, the tilting angle of each valve segment 33 is controlled at all times to be within a constant range.

The specific density of the overall display valve 31 is selected to be larger than that of the colored fluid 29 and smaller than that of the transparent fluid 30. Under the normal state, the underside of the valve segment 33 is immersed completely in the transparent fluid 30, and a gap is formed between the valve segment 33 and the bottom 18*a* of the display tube 18 serving as a display window as well.

In the present embodiment, the specific density of the fan-shaped valve members and the transparent fluid 30, the effective specific density of the display valve 31 as a whole, and the specific density of the colored fluid 29 and the connecting member 34 is selected to be such that the specific density is in a decreasing order of magnitude.

The operation of the overcurrent condition display is now described. When an overcurrent in excess of a present value has passed through the distribution cable 105, a secondary current is generated in the current transformer 106 so that the output shaft of the rotary solenoid 107 is actuated by the control circuit 108 and is turned in a 45-degree arc against the restoring force of the enclosed restoring spring 109.

Figure 4B:
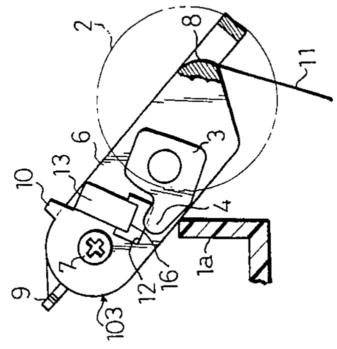

At this time, the operating member 3 is turned by the drive plate 2 in the direction of the arrow mark in FIG. 4*a* from the position shown in FIG. 4*a* to the position shown in FIG. 4*b*. When the member 3 is turned in this manner as above, the pawl 4 acts to thrust the oblique portion 13*a* of the stop member 13 towards the hoist member 6 against its resiliency (FIG. 3*b*), and then to release the thrust on the portion 13*a* as the member 13 is turned further somewhat below the surface 16 (FIG. 4*b*). The portion 13*a* may then be returned to its former position on account of its own resiliency.

Thus far, the operation of the operating member 3 takes place instantly as the result of the partial rotation of the solenoid 107.

Upon termination of such partial rotation, the output shaft of the rotary solenoid 107 starts to be turned by the restoring spring 109 in the opposite direction, that is, in the direction opposite to the driving direction.

Figure 3C:
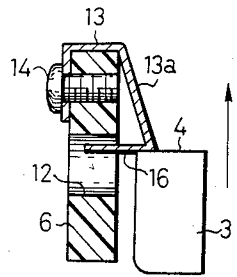
Figure 4C:
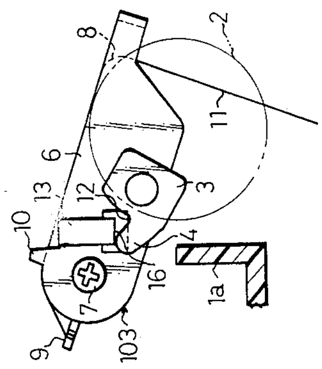

Thus, when the pawl 4 has been turned to the position shown in FIG. 3*c* or FIG. 4*c*, it is engaged by the surface 16 of the stop member 13. Thus the foremost part of the hoist member 6 is turned upwards to hoist the string member 11. Subsequently, the display valve 31 of the display section 104 is hoisted by said string member 11 against its own gravity and viscosity resistance of the fluids 29 and 30.

In this process, the display valve 31 is tilted by a certain angle, with the fan-shaped valve segments 33 thereof being flexed down against the resiliency of the flexible portion 34*a*, and is pulled up in its entirety into the colored fluid 29.

Figure 4D:
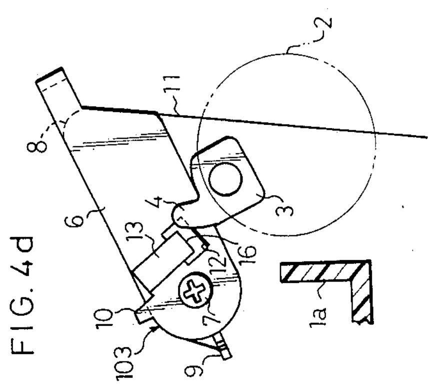
Figure 4E:
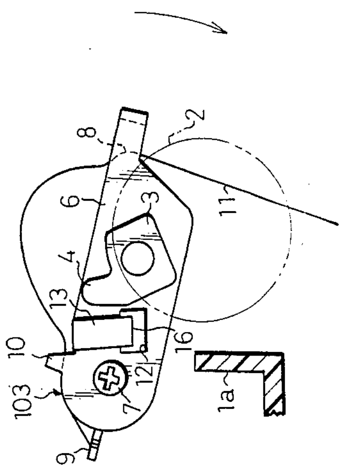
Figure 6:
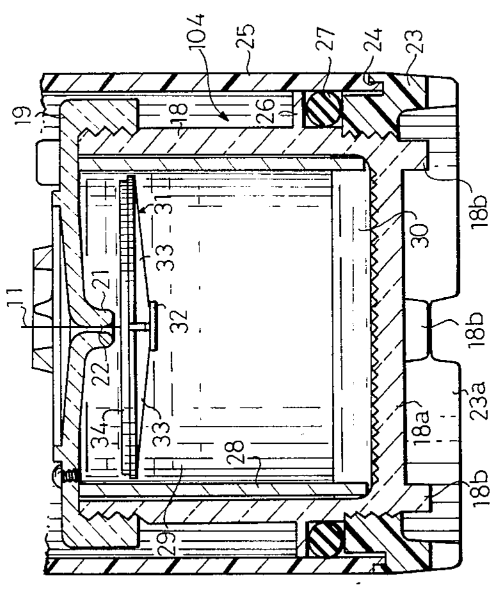
FIG. 6 is a partially sectional view of the display with the display valve raised to the display state to indicate the overcurrent condition.
Figure 9:
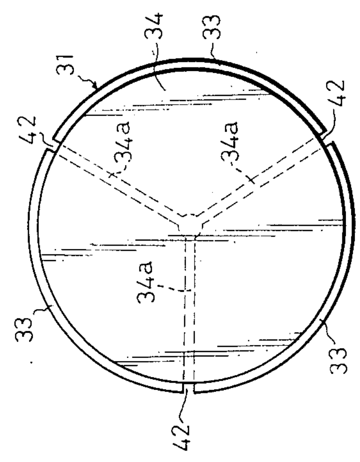
FIG. 9 is a plan view of the display valve.
Figure 5:
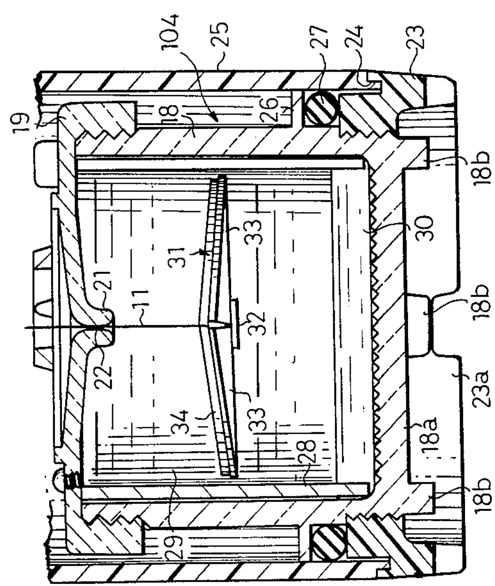
FIG. 5 is a partially sectional view of the display with a display valve being in upward motion.
Figure 7:
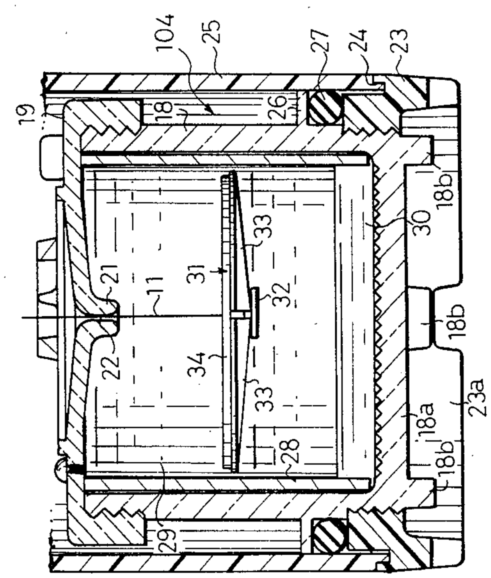
FIG. 7 is a partially sectional view of the display with the display valve being in downward motion.

As the pawl 4 is turned further upwards, the hoist operation of the display valve 31 is completed, as shown in FIG. 4*d*, the pawl 4 disengaging with the surface 16. The display valve 31 of the display section 104 is positioned in the upper portion of the colored fluid 29 as shown in FIG. 6 for indicating the overcurrent condition and the color of the fluid 29 can be checked through the bottom 18*a* of the display tube 18. The display valve 31 of the section 104 then starts to descend due to its gravity as shown in FIG. 7, with the upper and lower surfaces of the valve segments 33 being restored to original horizontal and conical surfaces respectively under the influence of the viscosity resistance of the colored fluid 29 and the resiliency of the connecting member 34.

The descending motion of the display valve 31 can be very slow because both the viscosity resistance and the buoyant force on the display valve act to oppose the gravity exerted on the valve. Thus a prolonged time limit such as of several hours can be obtained as the time interval of the descending motion.

The colored fluid 29 below the display valve 31 is forced radially towards the periphery of the display valve 31 along the conical underside of the valve 31. The fluid is then passed into the portion above the valve 31 through the cuts 40, and by way of the narrow gap between the valve segments 33 and the reflector 28 in the outer periphery of the valve segments 33. Accordingly, the display valve 31 can descend spontaneously in a highly stable manner as it is guided by the upward flow of the colored fluid 29 through these cuts 42.

The display valve 31 is retarded during the descending motion by the viscosity and the buoyant force of the colored fluid 29 and, after a predetermined time, the valve 31 is restored to display its normal state, with the whole underside of the valve segments contacting with and immersed into the transparent fluid 30.

At this time, when the underside of the valve segments 33 is immersed into the transparent fluid 30, that portion of the colored fluid 29 which is located below the lower surface of the valve segments 33 may be moved radially outwardly and upwards because the undersides of the valve segments tilt up gradually towards their periphery. Said portion of the colored fluid is then forced through the gap between the display valve 31 and the reflector 28 and joins the colored fluid 29 above the display valve 31.

During the descending motion of the display valve 31, the stopper member 32 mounted at the center of the lower surface of the valve 31 operates to support the underside of the downwardly tilting valve segments 33 and thus the tilting angle of the valve segments 33 can be limited to within a predetermined value. In this manner, the excess downward tilting of the display valve 31 may be excluded, and upon termination of the hoist operation and the start of the spontaneous descent of the display valve 31, the valve segments 33 can be restored from the tilted to the horizontal states.

Since the surface of the stopper member 32 is plated with metal, there is no risk that the pigment contained in the fluid 29 be deposited on the stop member 32.

In the present embodiment, the string member 11 is secured to the projection 9 and in the slit 10*a* of the pivotable hoist member 6, and extended down through the guide hole 8 towards the display tube 18. Thus, when the hoist member 6 is pivoted by its own gravity in the direction of the arrow mark in FIG. 4*e* after the completion of the hoist operation, the string member 11 may be flexed upwards under a tensile force at the portion thereof intermediate between the guide hole 8 and the slit 10*a*. Hence, the string member 11 is neither liable to flex sidewise nor to be caught by near-by elements, thus assuring a reliable operation of the drive-transmission section 103 and the display section 104.

The member acting as a kind of cam is the resilient stop member 13 bent into the required shape and thus can be fabricated easily.

In the present embodiment, the connecting member 34 is made of such a resilient closed cell plastic material with a specific gravity larger than that of the colored fluid 29, as polyethylene, and bonded to the upper surface of the valve segments 33 having a specific gravity higher than that of the colored fluid 29. Accordingly, the specific gravity of the overall display valve 31 may be adjusted easily to be slightly larger that that of the colored fluid 29. Thus, by modifying the size of the connecting member 34, the specific gravity of the whole display valve 31 can be changed for delicately changing the prolonged descent time of the display valve.

Moreover, since the specific gravity of the lower valve segments is selected to be higher than that of the upper connecting member 34, there is no possibility that the valve segments 33 be flexed upwards about its center during the vertical travel of the valve member 31. In addition, such vertical travel of the display valve 31 may be highly stabilized because the center of gravity of the whole display valve 31 is disposed in the lower portion of the valve 31.

In the present embodiment, the deposit preventing portion 18*c* consisting of numerous indentations is provided on the inner surface of that bottom of the display tube which serves simultaneously as a display window. Thus, even supposing that the viscous colored fluid 29 has intruded on these indentations, the colored fluid 29 is hardly liable to be deposited on the bottom surface of the display tube 18 owing to the surface tension of the fluid.

In the present invention, plural support legs 18*b* are provided on the lower end of the display tube 18, and hence the tube 18 can be erected upright during a mounting process for preventing the underside of the transparent bottom 18*a* from being fouled or damaged.

In the present embodiment, the reflector 28 made of aluminum or the like metal is fitted inside the display tube 18, so that the gap between the inner surface of the reflector 28 and the outer peripheral edge of the display valve 31 can be made constant easily by finely machining the surface and the edge. In this manner, the undesirable influence of the variation of various sizes caused by aging or temperature change can be minimized.

The inner bottom surface of the display tube 18 may be designed to be in the form of Frenel lens or of other fine indentations.

When the overcurrent display is viewed from directly below the display tube 18, the color either of the colored fluid 29 or of the display valve 31 can be checked through the transparent bottom 18*a*. When the display is viewed from laterally, the direct view of the colored fluid 29 is obstructed by the skirt member 23. However, when the display valve 31 is hoisted, the overcurrent condition can be identified through the presence of such coloration of the lower portion 23*a* of the skirt member 23 as caused by irregular reflection of the ray from the colored fluid 29 stored below the display valve 31. Thus a broader viewing range of the display status can be obtained as compared with a conventional display where the skirt member 23 is omitted and the bottom 18*a* of the display tube 18 used simultaneously as a display window is formed in a simple planar one.

In the case of the above display, if the inner surface of the display tube 18 and the underside of the display valve 31 are coated with a material of such a highly reflective color as white, silver or yellow, the light transmitted through the colored fluid 29 is reflected by the coating material and thus the color of the fluid 29 can be identified clearly when the display is viewed from below the display tube 18.

When the display is rolled, the colored fluid 29 stored in the display tube 18 is intruded into the insertion opening 22 for the string member 11 formed in the cap 19 of the display tube 18. However, there is scarcely any possibility of the leakage of the colored fluid 29 out of the display tube 18 because of the small diameter of the insertion opening 22 and the surface tension and the viscosity of the colored fluid 29.

Within the predetermined range of variation of the environmental temperature, an overflow volume of the colored fluid 29 brought about by the thermal expansion of the fluids 29 and 30 is accommodated in the insertion opening 22. When the environmental temperature rises beyond such predetermined range, the fluid 29 may overflow through the insertion opening 22 into the storage section 19*b*, but the colored fluid 29 can be prevented by the annular rib 19*a* from flowing out of the storage section 19*b*. When the thermally expanded fluid 29 is cooled, such portion of the fluid 29 as having overflowed into the storage section 19*b* can be guided by the funnel-shaped guide surface 19*c* to flow back into the display tube 18 through the insertion opening 22 and hence no colored fluid will remain in the storage section 19*b*.

When the display is topsy-turvied by wind pressure or the like as shown in FIG. 12, the transparent fluid 30 having a specific gravity higher than that of the colored fluid 29 flows down around the display valve 31 towards the cap 19, thus being settled in a lower separate layer below the upper layer of the fluid 29. However, since the insertion opening 22 is formed in the projection 21 protruding into the inside of the tube 18 to a height above the level of the lower layer of the transparent fluid 30, the transparent fluid 30 does not flow out through the insertion opening 22. On the other hand, since the opening 22 is of a reduced diameter, the colored fluid 29 is not liable to flow out therethrough on account of the heavy viscosity and the surface tension of the fluid.

Whenthe transparent fluid 30 and the colored fluid 29 are stored full in the display tube 18, these fluids are filled first short of the brim, and the cap 19 is then secured on the display tube 18. The small amount of the air remaining in the display tube 18 is discharged through the air vent hole 19*d*. The fluid 29 is then injected additively through the air vent hole 19*d* with a syringe or the like so that the air can be discharged completely from the inside of the tube 18. Then the screw 19*e* is driven into the air vent hole 19*d* and thus the tube can be filled to the brim.

According to the present embodiment, since the air vent hole 19*d* is provided in the cap 19, the fluids can be charged full into the tube 18 easily with the simultaneous exhaust of air from the interior of the display tube 18.

A modified embodiment of the present invention is described referring to FIG. 14.

The present embodiment differs from the preceding one in that the display valve 31 is formed as an integral piece of light metal or synthetic material, has its bottom surface of such a shape as increasing the thickness of the valve 31 from the outer periphery towards the center and is provided with plural cuts 42 formed in the outer periphery thereof. The display valve 31 has a specific gravity slightly higher than that of the colored fluid 29.

When the display valve 31 is hoisted by the hoist section 103 into the colored fluid 29, the part of the fluid 29 above the display valve 31 flows down below the display valve 31 through cuts 42 formed in the outer periphery of the display valve 31. Upon the termination of the hoist operation, since display valve 31 has the specific gravity only slightly higher than that of the colored fluid 29, and since the fluid 29 has viscosity resistance, the valve 31 descends spontanesouly in a prolonged time. At this time, the cuts 42 of the display valve 31 provide a passageway for the colored fluid 29, and the display valve 31 may be guided by the upward flow of the colored fluid 29 through the passageway, and thus can descend in a stabilized state.

In the case of the present embodiment, if the display valve is made of a synthetic material, metallic plating or coating may be applied on the lower surface, or a metallic material may be incorporated into the synthetic material for the purpose of increasing the specific gravity of the display valve slightly as compared with that of the colored fluid 29.

A further modification is described referring to FIG. 15.

The display valve of the present embodiment is substantially similar to that shown in FIG. 14 except that the valve as a whole is made in the form of a simple disc.

Hence, the display valve 31 of the present embodiment lacks in the function of guide the colored fluid 29 below the lower surface of the valve 31 towards its outer periphery.

The display valve 31 shown in FIG. 16*a* comprises a disc-like display plate 43 having a specific gravity higher than that of the fluid 29 and a float member 44 formed of expanded closed cell plastic material such as polyethylene. The float member 44 has a specific gravity lower than that of the colored fluid 29 and is secured on the upper surface of the display plate 43. The specific gravity of the display valve as a whole is selected to be slightly higher than that of the colored fluid 29. The valve has a plurality of cuts 42 at its periphery, with the float member 44 being the same in the diameter as the display plate 43.

The display valve 31 shown in FIG. 16*b* differs from the valve shown in FIG. 16*a* in that the float member 44 has a diameter smaller than that of the display plate 43.

The display valve 31 shown in FIG. 17*a* differs from the valve shown in FIG. 16*a* in that through holes 52 are formed near the periphery of the valve 31 in place of the cuts 42 shown in FIG. 16*a*.

The display valve 31 shown in FIG. 17*b* differs from the valve shown in FIG. 16*b* in that through holes 52 are provided near the periphery of the display valve 31 in place of the slits 42 shown in FIG. 16*b*.

The cuts 42 and through holes 52 of the embodiments shown in FIGS. 16 and 17 provide a passage means for guiding the portion of the colored fluid 29 above the valve downwards during the upward travel of the display valve. Thus the resistance of the colored fluid 29 is reduced and the smooth travel of the display valve 31 results. In this case, the display valve 31 may be fabricated easily because the connecting member 34 provided with its flexible portion 34*a* and valve segments 33 can be dispensed with.

In the present embodiment, the cuts 42 and the through holes 52 are designed for defining a passage means to guide positively the colored fluid 29 during the upward travel of the display valve 31. Since the specific gravity of the display valve 31 is selected to be higher only slightly than that of the colored fluid 29, the display valve 31 can descend in a sufficiently prolonged time. The cuts 42 and the through holes 52 may be adapted so as not to be obstructive of the prolonged descending travel of the display valve.

A further modification is described referring to FIG. 18.

In the present modification, the display valve 31 shown in FIG. 16*b* is used. A rib 45 is provided on the inner surface of the display tube 18 for extending vertically and fitting loosely into a corresponding cut 62 in the periphery of the valve 31. Thus, the display valve 31 can be guided by the rib 45 smoothly in its vertical travel. The display valve shown in FIG. 16*a* may also be used in this modification.

A modified form of the skirt member 23 is described referring to FIG. 19. In this modification, the skirt member 23 of the display tube 18 is not extended beyond the lower edge of the casing member 25 and instead a light reflector 46 of white or the like color is applied to the lower end portion of the internal surface of the casing member 25 confronting the skirt member 23. In this arrangement, the color of the fluid 29 can be seen at the skirt member 23 on account of irregular reflection. When the display is viewed from the lower lateral side, where the bottom of the tube 18 is invisible to a viewer, the coloration of the inner surface of such portion of the skirt member 23 as is farther away from the viewer can be seen clearly by the viewer to check the display status of the display.

In the first embodiment shown in FIG. 1, the specific density of the colored fluid 29 may be higher than that of the transparent fluid 30 and the specific density of the display valve 31 may lie between those of the two fluids. In this case, the display valve 31 can ascend very slowly after having been pulled down by a suitable member similar to the hoist member 6. The overcurrent or the normal condition can be observed from above through an appropriate transparent cap.

Since it is evident that broadly different modifications may be conceived without departing from the spirit and the scope of the invention, the present invention is not limited to any particular embodiment thereof except as defined in the appended claims.

What is claimed is:

1. An overcurrent condition display comprising
- a current sensor section having a current transformer;
- a drive section including a drive element and a force storage means, said drive element being driven by the overcurrent sensed by said current sensor section, to thereby actuate the force storage means to accumulate restoration force therein so that after movement of the drive element actuated by overcurrent is stopped, the drive element returns to the original position by the restoration force;
- a drive-transmission section situated adjacent to the drive element, said drive-transmission section being actuated by rotation of the drive element due to the restoration force of said force storage means, said drive-transmission section automatically returning to the original position after actuation by the restoration force; and
- a display section including a display tube having at least a translucent portion as viewed from below, a fluid stored in said tube and a display element connected to said drive-transmission section for vertical movement in said fluid, the overcurrent condition being display as the result of the state of said display element hoisted by said drive-transmission section, and the display of the normal state being established by said display element having descended slowly under the influence of its own gravity and the viscosity of said fluid in a predetermined time.

2. An overcurrent condition display as claimed in claim 1 wherein said fluid is colorless and viscous.

3. An overcurrent condition display as claimed in claim 1 wherein said fluid is colored and viscous.

4. An overcurrent condition display as claimed in claim 1 wherein said fluid consists of two liquid layers of different specific density.

5. An overcurrent condition display as claimed in claim 1 wherein said fluid is the combination of a colored viscous fluid and another transparent fluid of a higher specific density.

6. An overcurrent condition display as claimed in claim 1 wherein said fluid is the combination of a colored viscous fluid and another colorless transparent fluid of a higher specific density.

7. An overcurrent condition display as claimed in claim 1 wherein said drive element comprises a rotary solenoid enclosing said force storage means, and an operating member secured on an output shaft of said rotary solenoid.

8. An overcurrent condition display as claimed in claim 1 wherein said drive element comprises a rotary solenoid enclosing a restoring spring acting as said force storage means and an operating member secured on an output shaft of said rotary solenoid.

9. An overcurrent condition display as claimed in claim 1 wherein said current sensor section includes a control circuit adapted to control the current generated in said current transformer for driving said drive element, said current transformer being coupled with a distribution cable.

10. An overcurrent condition display as claimed in claim 1 wherein said drive-transmission section comprises a cam member and a hoist member engaging said cam member and connected with said display element, said cam member being actuated by said drive section only when said drive element is in restoring motion and thereby hoisting said display element.

11. An overcurrent condition display as claimed in claim 1 said drive-transmission section comprises a resilient stop member acting as a kind of cam member as well and a hoist member connected to said stop member, said stop member being provided with a bendable portion adapted to be retreated against its resiliency by the pressure exerted by said drive element at the time of sensing the overcurrent and with an engaging portion engaging with said drive element in restoring motion.

12. An overcurrent condition display as claimed in claim 1 wherein said display tube is provided with a transparent lid to form a display window, and said fluid is the combination of a transparent fluid and a colored viscous fluid, said transparent fluid having a density less than that of the colored fluid so that the transparent fluid is located above the colored fluid in a stable condition, said display element being of a specific density at least lower than that of said colored viscous fluid, the overcurrent condition being displayed as the result of the state of said display element pulled down by said drive-transmission section, and the display of the normal state being established by said display element having descended slowly under the influence of its own gravity and the viscosity of said viscous fluid in a predetermined time.

13. An overcurrent condition display comprising a current sensor section including a sensing current transformer coupled with a distribution cable and a control circuit adapted to control the current generated in said current transformer;
- a drive section including a rotary solenoid with an output shaft adapted to be driven by said control circuit, a restoring spring biased by said rotary solenoid and acting as a restoring means for said rotary solenoid, and an operating member secured on the output shaft of said rotary solenoid;
- a drive-transmission section including a resilient stop member acting as a kind of cam member as well, a hoist member connected to said stop member and a string member connected to said hoist member, said stop member having a bendable portion adapted to be retreated against its resiliency by the pressure exerted by said rotary solenoid at the time of sensing the overcurrent and an engaging portion engaging with said operating member in restoring motion; and
- a display section including a display tube with a transparent bottom to form a display window and with a lid, a transparent fluid in said display tube, a colored viscous fluid in said display tube, said transparent fluid having a density higher that that of the colored fluid so that the transparent fluid is located below the colored fluid in a stable condition, and a discoid display valve having a specific density higher at least than that of the colored viscous fluid and is tinted with a color, said display valve being connected with said hoist member through said string member for vertical motion at least in said colored viscous fluid, said display valve being hoisted by said hoist member only when said rotary solenoid is in restoring motion, thereby the color of said colored viscous fluid displaying the overcurrent condition and the color of said display valve viewed through said transparent fluid and said display window displaying the normal condition when said display valve moves downwardly under the influence of its own gravity and the viscosity resistance in a predetermined time.

14. An overcurrent condition display as claimed in claim 13 wherein said hoist member has a mounting projection at one end thereof for securing one end of said string member, a through guide hole at the other end thereof for passing said string member to said display tube and a slit for receiving said string member between said mounting projection and said through guide hole.

15. An overcurrent condition display as claimed in claim 13 wherein said display valve includes equal fan-shaped valve segments and a connecting member connecting together said valve segments at their upper surfaces.

16. An overcurrent condition display as claimed in claim 13 wherein said display valve includes equal fan-shaped valve segments of light metal or synthetic resin and a connecting member connecting said valve segments together at their upper surfaces.

17. An overcurrent condition display as claimed in claim 13 wherein said display valve is provided with peripheral cuts at equal angular intervals.

18. An overcurrent condition display as claimed in claim 13 wherein said display valve includes equal fan-shaped valve segments and a connecting member connecting said valve segments together with a gap between any adjacent two of them, the radius of said connecting member being smaller than that of said valve segments, and said display valve being provided with peripheral cuts at equal angular intervals.

19. An overcurrent condition display as claimed in claim 13 wherein the underside of said display valve is a conical surface to increase the thickness of said display valve from the periphery towards the center of said display valve.

20. An overcurrent condition display as claimed in claim 13 wherein said display valve includes equal fan-shaped valve segments, a connecting member connecting said valve segments together at their upper surfaces and a stopper member for securing the other end of said string member to the lower central surface of said display valve, said stopper member being provided with an abutting flange abutting on the lower surface of said connecting member and a stop flange engaging with the lower surfaces of said fan-shaped valve segments and limiting the tilting angle of said display valve.

21. An overcurrent condition display as claimed in claim 13 wherein said display valve includes equal fan-shaped valve segments, a connecting member connecting said valve segments together at their upper surfaces and a stopper member for securing the other end of said string member to the lower central surface of said display valve, said stopper member being provided with an abutting flange abutting on the lower surface of said connecting member, a stop flange engaging with the lower surfaces of said fan-shaped valve segments and limiting the tilting angle of said display valve, and an engaging barrel formed between said abutting flange and said stop flange, said stopper member being provided at one side thereof with a first cut extending through said abutting flange, said engaging barrel and said stop flange and at another side thereof with a second cut extending through said abutting flange and said stop flange, and said string member secured on said hoist member being connected to said stopper member so that the string member passes through said first cut from above, turns on the underside of said stop flange and extends into said second cut to be would about said barrel for undetachable hold.

22. An overcurrent condition display as claimed in claim 13 wherein at least one of the internal side surface of said display valve, the lowermost portion of said internal surface under the bottom of said display tube and the underside of said display valve are provided with reflectors of effective light reflecting color.

23. An overcurrent condition display as claimed in claim 13 wherein said display valve includes equal fan-shaped valve segments and a connecting member connecting said fan-shaped valve segments together at their upper surfaces, the specific density of said connecting member, said colored viscous fluid, said display valve as a whole, said transparent fluid and said valve segments increases in this order.

24. An overcurrent condition display as claimed in claim 13 wherein the inner surface of said display window is provided with a deposit preventing portion having fine indentations, the colored viscous fluid being prevented from being deposited on said internal surface of said display window owing to the surface tension of said fluid and thereby an erroneous observation of the overcurrent condition being excluded.

25. An overcurrent condition display as claimed in claim 13 wherein the internal surface of said display window is provided with a deposit preventing portion having a multiplicity of grooves in the form of concentric circles, the colored viscous fluid being prevented from being deposited on said internal surface of said display window owing to the surface tension of said fluid and thereby the erroneous observation of the overcurrent condition being excluded.

26. An overcurrent condition display as claimed in claim 13 wherein said display tube is provided with legs extending from the peripheral portion of said bottom, said display tube being erected upright on said legs at the time of assembling.

27. An overcurrent condition display as claimed in claim 13 wherein said lid has a central insertion opening, said opening being passed through by said string member with one end attached to said hoist member and with the other end secured on said display valve.

28. An overcurrent condition display as claimed in claim 13 wherein said lid has a central insertion opening protruding towards the inside of said display tube, said opening being passed through by said string member with one end attached to said hoist member and with the other end secured on said display valve, and said insertion opening being of such length that said insertion opening may protrude over the level of said transparent fluid when said display tube is topsy-turvied.

29. An overcurrent condition display as claimed in claim 13 wherein said lid is provided with a central insertion opening and an expanded fluid storage section in the form of an annular rib encircling said insertion opening on the upper surface of said lid, an overflow of thermally expanded fluids being accommodated within said storage section.

30. An overcurrent condition display as claimed in claim 13 wherein said lid is provided with a central insertion opening and an expanded fluid storage section in the form of an annular rib enclosing said insertion opening on the upper surface of said lid, such part of said lid as enclosed by said rib being provided with a funnel-shaped guide surface, and an overflow of thermally expanded fluids being guided by said guide surface to be accommodated within said storage section.

31. An overcurrent condition display as claimed in claim 13 wherein said lid is provided with a central insertion opening, an expanded fluid storage section in the form of an annular rib encircling said insertion opening on the upper surface of said lid and an air vent through hole communicating the inside with the outside of said display tube, an overflow of thermally expanded fluids being accommodated within said storage section.

32. An overcurrent condition display as claimed in claim 13 wherein the lower bottom surface of said display tube is planar and said display tube is provided with a skirt member extending downwards from the bottom portion of the side surface of said display tube.

33. An overcurrent condition display comprising a current sensor section including a sensing current transformer coupled with a distribution cable and a control circuit adapted to control the current generated in said current transformer;

a drive section including a rotary solenoid with an output shaft adapted to be driven by said control circuit and enclosing a restoring spring acting as a force storage means and an operating member secured on the output shaft of said rotary solenoid;

a drive-transmission section including a resilient stop member acting as a kind of cam member as well, a hoist member connected to said stop member and a string member connected to said hoist member, said stop member having a bendable portion adapted to be retreated against its resiliency by the pressure exerted by said rotary solenoid at the time of sensing the overcurrent and an engaging portion engaging with said operating member in restoring motion, said hoist member having a mounting projection at one end thereof for securing one end of said string member, a through guide hole at a part opposite to said mounting projection for passing said string member therethrough and a slit for receiving said string member between said mounting projection and said through guide hole; and a display section including a display tube with a transparent bottom to form a display window and with a lid, a transparent fluid in said display tube, a colored viscous fluid in said display tube, said transparent fluid having a density higher than that of the colored fluid so that the transparent fluid is located below the colored fluid in a stable condition, and a discoid display valve having a specific density higher at least than that of said colored viscous fluid and being tinted with a color, said display valve being connected with said hoist member through said string member for vertical motion at least in said colored viscous fluid, said lid being provided with a central insertion opening, an expanded fluid storage section in the form of an annular rib encircling said insertion opening on the upper surface of said lid and an air vent through hole communicating the inside with the outside of said display tube, such part of said lid as encircled by said rib being provided with a funnel-shaped guide surface, an overflow of thermally expanded fluids being guided by said guide surface to be accommodated within said storage section, said display valve having equal fan-shaped valve segments, a connecting member connecting said valve segments together at their upper surfaces with a gap between any adjacent two of them and a stopper for securing the other end of said string member to the lower central surface of said display valve, said stopper member being provided with an abutting flange abutting on the lower surface of said connecting member, a stop flange engaging with the lower surfaces of said fan-shaped valve segments and limiting the tilting angle of said display valve and an engaging barrel formed between said abutting flange and said stop flange, said stopper member being provided at one side thereof with a first cut extending through said abutting flange, said engaging barrel and said stop flange and at another side thereof with a second cut extending through said abutting flange said said stop flange, and said string member secured on said hoist member being connected to said stopper member so that the string member passes through said first cut from above, turns on the underside of said stop flange and extends into said second cut to be would about said barrel for undetachable hold, said display valve being hoisted by said hoist member only when said rotary solenoid is in restoring motion, thereby the color of said colored viscous fluid displaying the overcurrent condition and the color of said display valve viewed through said transparent fluid and said display window displaying the normal condition when said display valve moves downwardly under the influence of its own gravity and the viscosity resistance in a predetermined time.

* * * * *